(12) United States Patent
Kim

(10) Patent No.: US 7,592,620 B2
(45) Date of Patent: Sep. 22, 2009

(54) ACTIVE MATRIX ORGANIC LIGHT-EMITTING DISPLAY DEVICE

(75) Inventor: Mu-Hyun Kim, Suwon-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 0 days.

(21) Appl. No.: 10/924,879

(22) Filed: Aug. 25, 2004

(65) Prior Publication Data
US 2005/0062039 A1 Mar. 24, 2005

(30) Foreign Application Priority Data
Sep. 18, 2003 (KR) .................. 10-2003-0064897

(51) Int. Cl.
*H01L 51/00* (2006.01)
(52) U.S. Cl. .............. 257/40; 257/83; 257/88; 257/443; 257/448; 257/E51.001
(58) Field of Classification Search .......... 257/57, 257/59, 72, 83, 257, 290, 351, 366, 40, 88, 257/443, 448
See application file for complete search history.

(56) References Cited

U.S. PATENT DOCUMENTS

| | | | |
|---|---|---|---|
| 6,605,497 B2 | 8/2003 | Yamazaki | |
| 6,876,350 B2* | 4/2005 | Koyama | 345/92 |
| 6,936,844 B1 | 8/2005 | Yamazaki | |
| 2002/0134981 A1* | 9/2002 | Nakamura et al. | 257/62 |
| 2002/0190924 A1 | 12/2002 | Asano | |
| 2003/0030382 A1 | 2/2003 | Koyama | |
| 2003/0227021 A1* | 12/2003 | Yamazaki et al. | 257/83 |
| 2004/0051102 A1* | 3/2004 | Miyazaki et al. | 257/72 |
| 2005/0082534 A1* | 4/2005 | Kim et al. | 257/72 |

FOREIGN PATENT DOCUMENTS

| | | |
|---|---|---|
| CN | 1432858 | 7/2003 |
| JP | 2003-203783 | 7/2003 |
| KR | 1020020054850 | 7/2002 |
| KR | 1020020065225 | 8/2002 |
| KR | 1020020074897 | 10/2002 |

OTHER PUBLICATIONS

Chinese Office Action dated Apr. 11, 2008.

* cited by examiner

*Primary Examiner*—Wai-Sing Louie
(74) *Attorney, Agent, or Firm*—H.C. Park & Associates, PLC

(57) ABSTRACT

An active matrix organic light-emitting display device comprises a substrate, an active layer having a channel region and source and drain regions positioned on a predetermined region of the substrate. A first electrode is connected to one of the source and drain regions and extended onto the substrate, and has a multi-layer structure formed of at least one conductive layer. A second electrode is spaced from the first electrode to be connected to the other of the source and drain regions, and has the same stacked structure formed of conductive layer as the first electrode. An organic functional layer having at least an organic emission layer is positioned on the first electrode. A third electrode is positioned on the organic functional layer.

5 Claims, 3 Drawing Sheets

ACTIVE MATRIX ORGANIC LIGHT-EMITTING DISPLAY DEVICE

CROSS-REFERENCE TO RELATED APPLICATION

This application claims the benefit of Korea Patent Application No. 2003-64897 filed on Sep. 18, 2003, the disclosure of which is incorporated herein by reference in its entirety.

FIELD OF THE INVENTION

The present invention relates to an organic light-emitting display device (hereinafter, referred to as OLED) and, more particularly, to an active matrix OLED.

BACKGROUND OF THE INVENTION

In general, an OLED comprises an anode, a cathode and an emission layer interposed between the anode and the cathode. When a voltage is applied between the anode and the cathode, holes and electrons are injected into the emission layer, and then combined to create exitons which decay radiatively. This radiation is called electroluminescence (EL)

The OLED may be classified as a passive matrix (hereinafter, referred to as PM) type and an active matrix (hereinafter, referred to as AM) type, based on a manner for driving pixels of N×M arranged in a matrix. The AM type OLED, also referred to as an AMOLED, may have less power consumption and higher resolution then the PM type, and it may be suitable for large area implementation.

FIG. 1 shows a cross-sectional view illustrating a structure and a method for fabricating a conventional AMOLED.

Referring to FIG. 1, a buffer layer 105 is formed on an insulation substrate 100 having an emitting region A and a non-emitting region B. An active layer 171 has a source region 171a, a drain region 170b, and a channel region 171c and is formed on the buffer layer 105 of the non-emitting region B. A gate-insulating layer 173 is formed on the active layer 171, and a gate electrode 175 is formed on the gate-insulating layer 173 to correspond to the channel region 171c. A first insulation layer 176 is formed over the entire surface of the substrate, including the gate electrode 175. Contact holes exposing each of the source and drain regions 171a and 171b are formed in the first insulation layer 176. A source electrode 177 and a drain electrode 178 are formed on the first insulation layer 176 to connect to the source and the drain regions 171a and 171b through the contact holes, respectively. The active layer 171, the gate electrode 175, the source electrode 177 and the drain electrode 178 constitute a driving TFT 170.

A second insulation layer 180 is then formed over the entire surface of the substrate, including the source and drain electrodes 177 and 178, and a via hole 183 is formed in the second insulation layer 180 to expose the drain electrode 178. A pixel electrode 191 is then formed on the second insulation layer 180 of the emitting region A, which is connected to the exposed drain electrode 178 through the via hole 183. The pixel electrode 191 has a bent portion 191a within the via hole 183. A pixel defining layer 185 is formed to cover the bent portion 191a. An opening P for exposing the pixel electrode 191 at a position spaced from the via hole 183, namely the bent portion 191a, is formed in the pixel defining layer 185. An organic emission layer 195 is then formed over the exposed pixel electrode 191 within the opening P, and an opposite electrode 199 is formed on the organic emission layer 195. As a result, an organic electroluminescent diode 190 having the pixel electrode 191, the organic emission layer 195, and the opposite electrode 199 is formed. The organic electroluminescent diode 190 is connected to and driven by the driving TFT 170 through the via hole 183.

Since the pixel defining layer 185 is formed to cover the bent portion 191a of the pixel electrode 191, the organic emission layer 195 is not formed on the bent portion 191a and prevents the organic emission layer 195 from being bent along the bent portion 191a of the pixel electrode 191. Therefore, degradation of the organic emission layer 195 due to the bend may be reduced or prohibited. However, the pixel defining layer 185 should be formed when the driving TFT 170 and the organic electroluminescent diode 190 are connected through the via hole 183, which increases the number of processes and masks required for the processes and increases the production cost.

In addition, the bent portion 191a of the pixel electrode 191 may cause defects due to a concentrated electric field at the bent portion 191a when driving the OLED.

SUMMARY OF THE INVENTION

An exemplary embodiment of the present invention provides an AMOLED which may reduce the number of masks and processes required for fabrication and reduce defects due to a via hole.

An exemplary embodiment of the present invention provides an OLED. The OLED comprises a substrate. An active layer having a channel region and source and drain regions is positioned on a predetermined region of the substrate. A first electrode is connected to one of the source and drain regions and extended onto the substrate, and has a stacked structure formed of at least one conductive layer. A second electrode is spaced from the first electrode to be connected to the other of the source and drain regions, and has the same stacked structure formed of conductive layer as the first electrode. An organic functional layer having at least an organic emission layer is positioned on the first electrode. A third electrode is positioned on the organic functional layer.

In various exemplary embodiments of the present invention, an OLED may further comprise a gate electrode positioned on the active layer to correspond to the channel region. A first insulation layer, including source and drain contact holes for exposing each of the source and drain regions, is positioned on the gate electrode and the active layer. In this case, the first and second electrodes may be formed on the first insulation layer to be connected to the source and drain regions through the source and drain contact holes, respectively.

BRIEF DESCRIPTION OF THE DRAWINGS

The above and other features and advantages of the present invention will become more apparent to those of ordinary skill in the art by describing in detail preferred embodiments thereof with reference to the attached drawings.

DETAILED DESCRIPTION OF THE INVENTION

Figure 1:
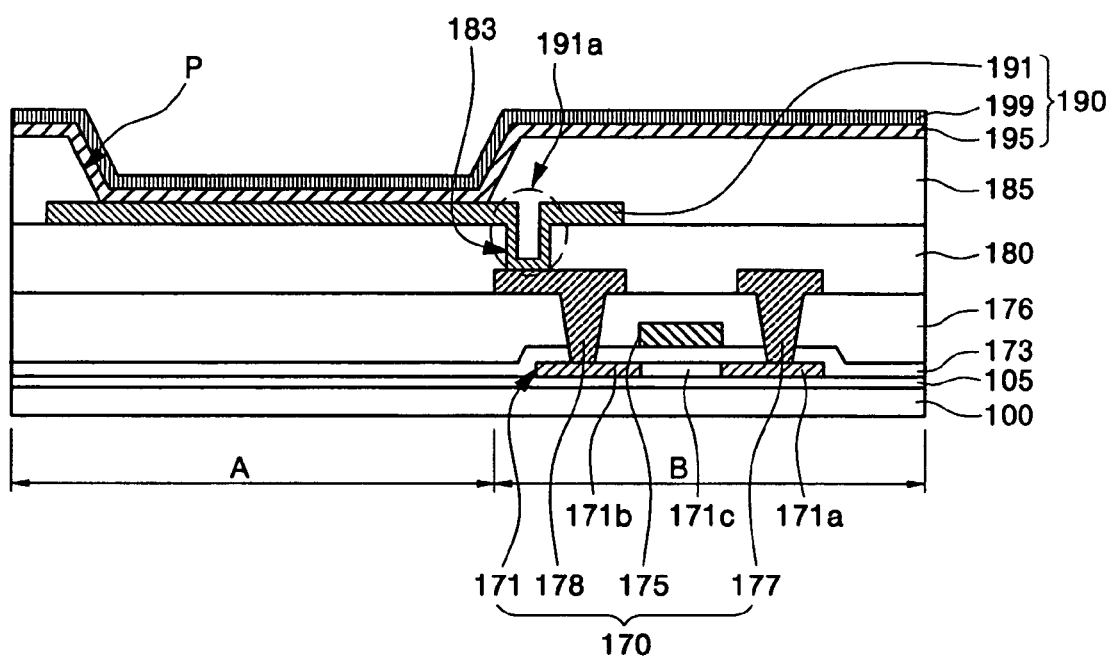
FIG. 1 shows a cross-sectional view illustrating a structure and a method for fabricating a conventional AMOLED.

The present invention will now be described more fully hereinafter with reference to the accompanying drawings, in which exemplary embodiments of the invention are shown. This invention, however, may be embodied in different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout the specification.

Figure 2:
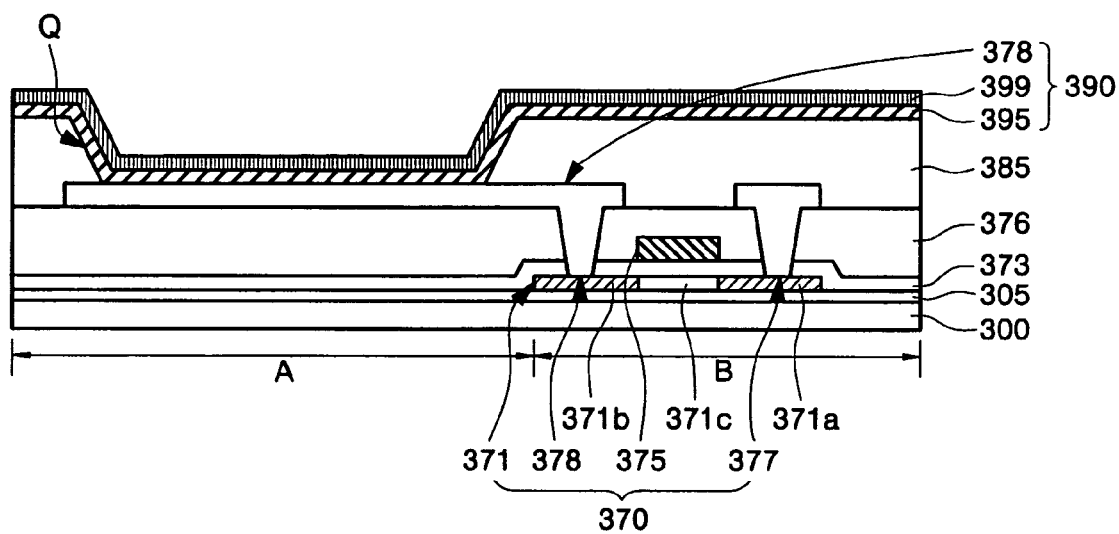
FIG. 2 shows a cross-sectional view illustrating an AMOLED and a method for fabricating the same in accordance with an embodiment of the present invention.

FIG. 2 shows a cross-sectional view illustrating an AMOLED and a method for fabricating the same in accordance with an embodiment of the present invention.

Referring to FIG. 2, a buffer layer 305 is formed on a substrate 300 having an emitting region A and a non-emitting region B. The substrate 300 may be an insulation substrate such as a glass, plastic or similar material. The buffer layer 305 may protect a TFT to be formed in a subsequent process from impurities, such as, but not limited to, alkali ions flowing out from the substrate 300. The buffer layer 305 may be formed of a silicon oxide layer, a silicon nitride layer, a double layer thereof or similar material.

An active layer 371 is formed on the buffer layer 305 of the non-emitting region B. The active layer 371 may be formed of amorphous silicon, polycrystalline silicon or similar material. A gate-insulating layer 373 is formed on the active layer 371. A gate electrode 375 is formed on the gate-insulating layer 373. Impurities may be doped into the active layer 371, using the gate electrode 375 as a mask, to form source and drain regions 371a and 371b in the active layer 371. At the same time, a channel region 371c may be defined between the source and drain regions 371a and 371b.

A first insulation layer 376 is formed over the entire surface of the substrate 300, including the gate electrode 375. Source and drain contact holes are formed in the first insulation layer 376 to expose each of the source and drain regions 371a and 371b. The first insulation layer 376 may be formed of a silicon oxide layer, a silicon nitride layer, a double layer thereof or similar material.

A single conductive layer may have a predetermined thickness on the first insulation layer 376 where the source and drain contact holes are already formed. The deposition may be performed, for example, using a vacuum deposition method, a sputtering method or other depositing method. The deposited conductive layer is patterned using a mask to form a first electrode 378 and a second electrode 377 having the same stacked structure of the conductive layer each other.

A driving TFT 370 having the active layer 371, the gate electrode 375, the first electrode 378 and the second electrode 377 is formed. The first electrode 378 and the second electrode 377 are source and drain electrodes of the driving TFT 370, and are connected to the source and drain regions 371b and 371a through the source and drain contact holes, respectively. The first electrode 378 is extended onto the first insulation layer 376 of the emitting region A, wherein the extended portion acts as a pixel electrode of an organic electroluminescent diode to be formed in a subsequent process. Thus, the first electrode 378 is the pixel electrode of the organic electroluminescent diode to be formed in a subsequent process and, at the same time, is the source or drain electrode of the driving TFT 370.

The first electrode 378 may be formed of a conductive layer having a low contact resistance with the active layer 371 and having an improved work function as a pixel electrode. The first electrode 378 may be formed of one selected from Al, Ni, Cr, AlNd, ITO, IZO or similar material.

A second insulation layer 385 is formed over the entire surface of the substrate having the first and the second electrodes 378 and 377. The second insulation layer 385 may be formed of an organic layer, such as benzocyclobutene (BCB) or similar material, a photosensitive insulation layer, or an inorganic layer such as a silicon nitride layer, a silicon oxide layer, a double layer of the silicon nitride and the silicon oxide layer, or similar material. The photosensitive insulation layer may be formed of imide based, acrylic based, or phenol based polymers or similar material.

An opening Q is formed within the second insulation layer 385 to expose the first electrode 378 of the emitting region A, and an organic functional layer 395 is formed on the first electrode 378 exposed within the opening Q. The first electrode 378 exposed within the opening Q acts as a pixel electrode of an organic electroluminescent diode to be formed in a subsequent process. The organic functional layer 395 includes at least an organic emission layer. The organic functional layer 395 may further include at least one selected from a charge injecting layer, a charge transporting layer, and a hole blocking layer. A third electrode 399 is formed on the organic functional layer 395. The third electrode 399 is a cathode when the first electrode 378 is an anode, and is an anode when the first electrode 378 is a cathode. The first electrode 378, the organic functional layer 395, and the third electrode 399 form an organic electroluminescent diode 390 driven by the driving TFT 370.

Figure 3:
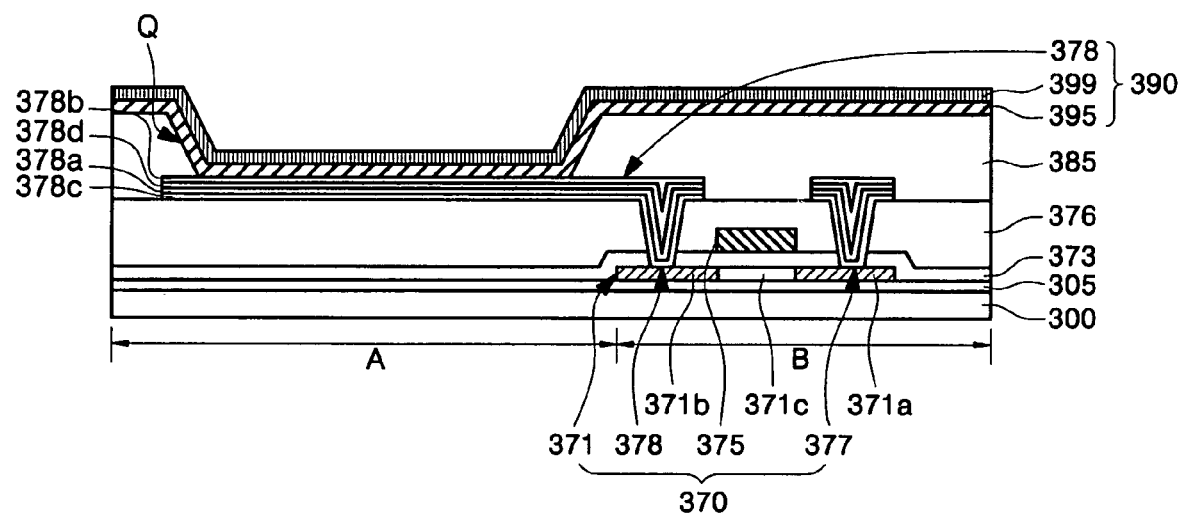
FIG. 3 shows a cross-sectional view illustrating an AMOLED and a method for fabricating the same in accordance with an embodiment of the present invention.

FIG. 3 shows a cross-sectional view illustrating an AMOLED and a method for fabricating the same in accordance with an embodiment of the present invention. In the AMOLED of the present embodiment, a stacked structure formed of conductive layers of a first electrode is different from the OLED shown in FIG. 2.

Referring to FIG. 3, a buffer layer 305 is formed on a substrate 300 having the emitting region A and the non-emitting region B, and an active layer 371 is formed on the buffer layer 305 of the non-emitting region B. A gate-insulating layer 373 is formed on the active layer 371, and a gate electrode 375 is formed on the gate-insulating layer 373. Impurities may be doped into the active layer 371 using the gate electrode 375 as a mask to form source and drain regions 371a and 371b in the active layer 371. At the same time, a channel region 371c is defined. The substrate 300, the buffer layer 305, the active layer 371, the gate-insulating layer 373, and the gate electrode 375 are described above in relation to FIG. 2.

A first insulation layer 376 is formed over the entire surface of the substrate, including the gate electrode 375, and source and drain contact holes are formed in the first insulation layer 376 to expose each of the source and drain regions 371a and 371b. At least two conductive layers may be deposited, such as one after another, with a predetermined thickness on the first insulation layer 376, where the source and drain contact holes are already formed. The deposition may be performed using a vacuum deposition method, a sputtering method or other depositing method. The deposited conductive layers may be patterned using a mask to form a first electrode 378 and a second electrode 377 having the same stacked structure of conductive layers.

A driving TFT 370 having the active layer 371, the gate electrode 375, the first electrode 378 and the second electrode 377 is formed. The first electrode 378 and the second electrode 377 are source and drain electrodes of the driving TFT 370, and are connected to the source and drain regions 371b and 371a through the source and drain contact holes, respectively. The first electrode 378 is extended onto the first insulation layer 376 of the emitting region A, wherein the extended portion acts as a pixel electrode of an organic electroluminescent diode to be formed in a subsequent process. The first electrode 378 is the pixel electrode of the organic electroluminescent diode to be formed in a subsequent process, and the source or drain electrode of the driving TFT 370 at the same time.

The first electrode 378 and the second electrode 377 may be formed of a multi-layered structure having a first conductive layer 378a and a second conductive layer 378b formed on the first conductive layer 378a. In this case, the first conductive layer 378a is in contact with the active layer 371, so that the first conductive layer 378a may be formed with material having a low contact resistance with the active layer 371. In addition, the second conductive layer 378b may be formed of a material having an improved work function to allow the first electrode 378 to act as a pixel electrode. The first conductive layer 378a may be formed of Ti, a Ti alloy or similar material, and the second conductive layer 378b may be formed of a material layer such as Al, Ni, Cr, AlNd, ITO, IZO or similar material. The layer formed of Ti, Ti alloy or similar material may have a higher hardness so that it can enhance the hardness of the first electrode 378 and the second electrode 377. The Ti, Ti alloy or similar material may react with the silicon of the active layer 371 to form silicide to reduce the contact resistance. In addition, when the second conductive layer 378b is formed of Al, for example, the layer formed of Ti, Ti alloy or similar material may prevent the silicon of the active layer 371 from being diffused into the Al.

On the other hand, the first conductive layer 378a may be formed of a material such as Al, Ni, Cr, AlNd or similar material. The second conductive layer 378b may be formed of a material different from that of the first conductive layer 378a, wherein the material is Al, Ni, Cr, AlNd, ITO, IZO or similar material. In this case, a third conductive layer 378c may be formed before the first conductive layer 378a is formed. The third conductive layer 378c may be formed of Ti, a Ti alloy or similar material. As mentioned above, the layer formed of Ti, Ti alloy or similar material may enhance the hardness of the first electrode 378 and the second electrode 377 and lower the contact resistance. In addition, when the first conductive layer 378a is formed of Al, for example, the layer formed of Ti, Ti alloy or similar material may prevent the silicon of the active layer 371 from being diffused into the Al.

The first conductive layer 378a also may be formed of a material such as Al, Ni, Cr, AlNd, or similar material and the second conductive layer 378b may be formed of a material such as Al, Ni, Cr, AlNd, ITO, IZO, or similar material, wherein the second conductive layer may formed of a material different from that of the first conductive layer 378a. A fourth conductive layer 378d may be formed before forming the second conductive layer 378b after the first conductive layer 378a is formed. In this case, the fourth conductive layer 378d may enhance the hardness of the first electrode 378 and the second electrode 377. The fourth conductive layer 378d may be formed of Ti, a Ti alloy or similar material. In this case, the third conductive layer 378c may be formed before the first conductive layer 378a is formed. The third conductive layer 378c may be formed of Ti, a Ti alloy or similar material. As mentioned above, the third conductive layer 378c formed of Ti, Ti alloy or similar material may enhance the hardness of the first and the second electrodes 378 and 377, and it may lower the contact resistance. In addition, when the first conductive layer 378a is formed of Al, for example, the layer formed of Ti, a Ti alloy or similar material may prevent the silicon of the active layer 371 from being diffused into the Al.

A second insulation layer 385 is formed over the entire surface of the substrate having the first and the second electrodes 378 and 377. An opening Q is formed within the second insulation layer 385 to expose the first electrode 378 of the emitting region A, and an organic functional layer 395 is formed on the first electrode 378 exposed within the opening Q. The first electrode 378 exposed within the opening Q acts as a pixel electrode of the organic electroluminescent diode to be formed in a subsequent process. A third electrode 399 is formed on the organic functional layer 395. The third electrode 399 is a cathode when the first electrode 378 is an anode, and is an anode when the first electrode 378 is a cathode. The first electrode 378, the organic functional layer 395, and the third electrode 399 form the organic electroluminescent diode 390 driven by the driving TFT 370. A description of the second insulation layer 385 and the organic functional layer 395 is provided above in relation to FIG. 2.

As mentioned above, the first electrode 378 is formed to act as a pixel electrode of the organic electroluminescent diode 390 and a source or drain electrode of the driving TFT at the same time. As a result, the via hole and the pixel defining layer may not be formed.

This reduces the number of processes and masks required for fabricating the OLED, and may reduce or eliminate defects due to the via hole.

Furthermore, the first electrode 378 may have a stacked structure formed of at least two conductive layers, so that it may have a lower contact resistance against the active layer 371 and an improved work function as a pixel electrode.

While the present invention has been described with reference to exemplary embodiments, it is understood that the disclosure has been made for purpose of illustrating the invention by way of examples and is not limited to limit the scope of the invention, and one skilled in the art can make amend and change the present invention without departing from the scope and spirit of the invention.

What is claimed is:

1. An organic light-emitting device, comprising:
   a substrate;
   an active layer having a channel region, a source region and a drain region positioned on a predetermined region of the substrate;
   a first electrode directly connected to one of the source region and the drain region and extended onto the substrate, the top surface of the first electrode being planar;
   a second electrode spaced from the first electrode to be connected to the other of the source region and drain region;
   an organic functional layer positioned directly on the planar top surface of the first electrode and having at least an organic emission layer; and
   a third electrode positioned on the organic functional layer, wherein the planar top surface of the first electrode is as high as a top surface of the second electrode, and wherein the first electrode and the second electrode consist of a single conductive layer.

2. The organic light-emitting device of claim 1, wherein the single conductive layer is formed of a material selected Al, Ni, Cr, AlNd, ITO, IZO or similar materials.

3. The organic light-emitting device of claim 2, wherein the organic functional layer further includes at least one of a charge injecting layer, a charge transporting layer, and a hole blocking layer.

4. The organic light-emitting device of claim 2, wherein the first electrode is a cathode, and the third electrode is an anode.

5. The organic light-emitting device of claim 2, wherein the first electrode is an anode, and the third electrode is a cathode.

* * * * *